United States Patent
Suuronen et al.

(10) Patent No.: US 8,592,786 B2
(45) Date of Patent: Nov. 26, 2013

(54) PLATEN CLAMPING SURFACE MONITORING

(71) Applicant: Varian Semiconductor Equipment Associates, Inc., Gloucester, MA (US)

(72) Inventors: David E. Suuronen, Newburyport, MA (US); Julian G. Blake, Gloucester, MA (US); Kurt Decker-Lucke, South Hamilton, MA (US); James Carroll, Amesbury, MA (US); Klaus Petry, Merrimac, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/832,073

(22) Filed: Mar. 15, 2013

(65) Prior Publication Data

US 2013/0248738 A1 Sep. 26, 2013

Related U.S. Application Data

(60) Provisional application No. 61/614,564, filed on Mar. 23, 2012.

(51) Int. Cl.
*H01J 37/317* (2006.01)
*H01L 21/265* (2006.01)
*G01F 23/00* (2006.01)

(52) U.S. Cl.
USPC .............. 250/492.21; 250/431; 250/441.11; 361/225

(58) Field of Classification Search
USPC ............... 250/492.21, 431, 441.11; 361/225
See application file for complete search history.

(56) References Cited

U.S. PATENT DOCUMENTS

| | | | |
|---|---|---|---|
| 5,886,865 A | | 3/1999 | Parkhe et al. |
| 6,947,274 B2 * | | 9/2005 | Kellerman et al. ........... 361/234 |
| 7,072,166 B2 * | | 7/2006 | Qin et al. ...................... 361/234 |
| 8,514,544 B2 * | | 8/2013 | McAnn et al. ................ 361/234 |
| 2008/0073564 A1 * | | 3/2008 | Mun ........................ 250/441.11 |
| 2012/0017938 A1 * | | 1/2012 | Weaver et al. .................... 134/6 |

OTHER PUBLICATIONS

Communication relating to the results of the Partial International Search, mailed Jun. 6, 2013 for PCT/US2013/033305 filed Mar. 21, 2013.

* cited by examiner

*Primary Examiner* — Nikita Wells

(57) ABSTRACT

An ion implanter includes a platen having a clamping surface configured to support a wafer for treatment with ions, the platen also having at least one pair of electrodes under the clamping surface, a clamping power supply configured to provide an AC signal to the at least one pair of electrodes and a sensed signal representative of the AC signal, and a controller. The controller is configured to receive the sensed signal from the clamping power supply when no wafer is clamped to the clamping surface. The controller is further configured to monitor the sensed signal and determine if the sensed signal is representative of deposits on the clamping surface exceeding a predetermined deposit threshold.

17 Claims, 4 Drawing Sheets

PLATEN CLAMPING SURFACE MONITORING

CROSS REFERENCE TO RELATED APPLICATIONS

This application claims the benefit of provisional patent application No. 61/614,564, filed Mar. 23, 2012, which is incorporated herein by reference.

FIELD

This invention relates to platens, and more particularly, to platen clamping surface monitoring.

BACKGROUND

Ion implantation is a standard technique for introducing conductivity-altering impurities into semiconductor wafers. Ion implantation may be performed by a beamline ion implanter or a plasma doping implanter. In a beamline ion implanter, a dopant gas may be ionized in an ion source and ions may be extracted from the ion source and accelerated to form a beam of desired energy. The ion beam may then be directed at a front surface of a wafer supported by a platen. The wafer may be a semiconductor wafer and the energetic ions in the ion beam may be embedded into the crystalline lattice of the semiconductor wafer to form a region of desired conductivity after a later anneal step. A plasma doping implanter positions a wafer supported by a platen in a plasma chamber. Plasma may be generated in the plasma chamber and ions from the plasma are accelerated towards the wafer, e.g., by biasing the wafer and/or the plasma chamber.

Most platens are electrostatic chucks that utilize electrostatic forces to clamp the wafer to a clamping surface of the platen. The clamping surface of the platen may become dirty over time due to deposits of ion beam byproducts, e.g., due to arsenic deposition in one instance when the ion beam is run into the dose Faraday cups for prolonged periods, accumulating on the clamping surface.

Deposits on the clamping surface of the platen are particularly problematic with hot ion implants or hot implants. Integrated circuit manufacturers are experimenting with hot implants for their next generation device development, e.g., fin field effect transistors (FinFETs). Hot implants typically occur at temperatures greater than 150° C. Some hot implants occur at greater than 300° C. and others occur between 300° C. and 750° C. In addition to typical deposits from ion beam byproducts, some deposits are more attracted to the hot clamping surface. In addition, thermally activated reactions can occur on the hot clamping surface of the platen to create additional deposits during hot implant processes. Trace amounts of materials such as carbon, fluorine, tungsten, and hydrogen may be present in an ion implanter. These materials can contribute to the thermally activated reactions to create additional unwanted deposits on the clamping surface of the platen. One example of this is decomposition of refractory metal from gaseous precursors. Another example is decomposition of carbon from a reaction of methane.

The accumulation of deposits on the clamping surface of the platen adversely impacts the clamping force provided by the platen. The deposits can shunt the electrostatic fields that hold the wafer. If not cleaned, the accumulation of deposits may reach an excessive level causing an inadvertent wafer drop and wafer breakage. A sputter clean process where low energy ions are directed to the clamping surface of a platen may be used to effectively clean the clamping surface. However, it is difficult to predict when a sputter clean process is necessary as the amount and location of deposit accumulation on the clamping surface depends on many variables. This may lead to excessive interruptions of ion processing for sputter cleaning. This degrades throughput performance or the number of wafers that can be processed over a given time interval and hence adversely impacts the cost of ownership. Alternatively, if not cleaned frequently enough, a risk of a wafer drop and breakage is present. In addition, it is difficult to monitor the amount of deposits in situ as the ion implanter is processing wafers.

Accordingly, there is a need in the art for monitoring the platen surface for an indication of excessive deposit accumulation.

SUMMARY

According to a one aspect of the disclosure, an ion implanter is provided. The ion implanter includes a platen having a clamping surface configured to support a wafer for treatment with ions, the platen also having at least one pair of electrodes under the clamping surface, a clamping power supply configured to provide an AC signal to the at least one pair of electrodes and a sensed signal representative of the AC signal, and a controller. The controller is configured to receive the sensed signal from the clamping power supply when no wafer is clamped to the clamping surface. The controller is further configured to monitor the sensed signal and determine if the sensed signal is representative of deposits on the clamping surface exceeding a predetermined deposit threshold.

According to another aspect of the disclosure, a method of operating an ion implanter includes: providing an AC signal to at least one pair of electrodes of a platen having a clamping surface; monitoring a sensed signal representative of the AC signal when no wafer is clamped to the clamping surface; and determining if the sensed signal is representative of deposits on the clamping surface exceeding a predetermined deposit threshold when no wafer is clamped to the clamping surface.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
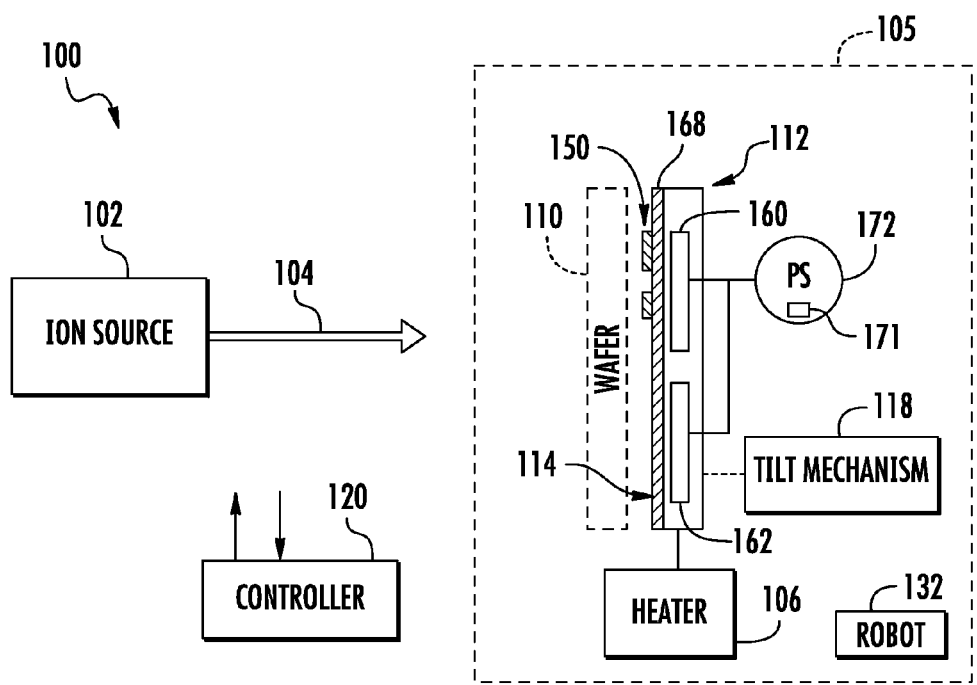
FIG. 1 is a schematic diagram of an ion implanter consistent with an embodiment.

Turning to FIG. 1, a block diagram of an ion implanter 100 is illustrated. The ion implanter 100 includes an ion source 102, an end station 105, and a controller 120. The end station 105 may include a platen 112, a clamping power supply 172, a robot 132, a tilt mechanism 118, and a heater 106. The ion source 102 is configured to generate an ion beam 104. The ion implanter 100 may include other beamline components known to those skilled in the art between the ion source 102 and the platen 112 to manipulate the ion beam 104 as it is directed towards a front surface of the wafer 110 supported by the platen 112. For ease of illustration, the wafer 110 is shown in phantom and slightly away from the clamping surface 114 of the platen 112. Those skilled in the art recognize that during operation, the wafer 110 is in intimate contact with the clamping surface 114. The wafer 110 may be a semiconductor wafer having a disk shape with a diameter of 300 millimeters (mm) or other diameter sizes. The clamping surface 114 of the platen 112 may have a similar disk shape to support the wafer 110.

The ion beam 104 may be a ribbon beam or a spot beam as is known in the art. The ion beam 104 may be distributed across the entire front surface of the wafer 110 by ion beam movement, wafer movement, or a combination of the two. In one embodiment, the ion beam 104 may be a ribbon beam with an approximate rectangular cross sectional shape. A long dimension of the ribbon beam may be at least three times greater than a short dimension. The wafer may be mechanically driven in a direction orthogonal to the long dimension of the ribbon beam to distribute the ribbon beam across the entire front surface of the wafer 110.

The end station 105 includes the platen 112. The platen 112 is an electrostatic chuck having a top dielectric layer 168 which forms the clamping surface 114. The platen 112 also has at least one pair of electrodes 160, 162 under the clamping surface 114. In some embodiments, the platen includes three pairs of electrodes or six electrodes in total. The clamping power supply 172 is configured to provide an alternating current (AC) signal to the electrodes 160, 162 to generate electrostatic forces to secure the wafer 110 to the clamping surface 114 of the platen 112. The AC signal is an electrical current that reverses direction at recurring intervals. Examples of AC signals include a square wave signal, a sinusoidal signal, or a quasi-square wave signal. Advantageously, the clamping power supply 172 also includes circuitry 171 configured to provide a sensed signal representative of the AC signal.

The end station 105 may also include automated wafer handling equipment for introducing wafers to, and removing wafers from, the platen 112. The automated wafer handling equipment may include the robot 132 to facilitate the movement of wafers to and from the platen 112. The automated wafer handling equipment may also include additional robots as necessary to facilitate movement of wafers from atmospheric conditions through a load lock to the platen 112 and out a load lock back to atmospheric conditions after ion treatment.

The tilt mechanism 118 is configured to tilt the platen 112 with respect to the ion beam 104. In one embodiment, the tilt mechanism 118 may tilt the platen 118 with respect to two orthogonal axes. A rotating platen or roplat may to be equipped with such capabilities.

The end station 105 may also include the heater 106 configured to heat the wafer 110 for a hot implant. The heater 106 may be external to the platen 112 and provide heat directly to the wafer 110 positioned on the platen when the wafer 110 is positioned proximate the heater. For example, the heater 106 may include one or more lamps to provide heat to the wafer for hot implants. Alternatively, the heater 106 may be positioned within the platen 112, e.g., a heating element or heat trace. Regardless of whether internal or external to the platen 112 (or both are used), the heater 106 is configured to enable hot implants at temperatures greater than 150° C. The heater 106 is also configured to enable hot implants at wafer temperatures greater than 300° C. including between 300° C. and 750° C.

The controller 120 can be or include a general-purpose computer or network of general-purpose computers that may be programmed to perform desired input/output functions. The controller 120 can also include other electronic circuitry or components, such as application specific integrated circuits, other hardwired or programmable electronic devices, discrete element circuits, etc. The controller 120 may also include communication devices, data storage devices, and software. The controller 120 may receive input signals from a variety of systems and components such as the clamping power supply 172, the robot 132, the tilt mechanism 118, the heater 106, and the ion source 102, and provide output signals to each to control the same.

In operation, a plurality of wafers may be cycled to and from the platen 112 for treatment with the ion beam 104. In the time periods between successive wafers being treated with the ion beam 104, no wafer is clamped to the platen 112. Over time, deposits 150 may accumulate on the clamping surface 114 of the platen 112. The deposits 150 are shown at an exaggerated size and shape for clarity of illustration only in FIG. 1. The deposits 150 may accumulate uniformly or more commonly non-uniformly on the clamping surface 114. These deposits 150 may be caused by ion beam byproducts, e.g., arsenic deposition in one instance. The amount of deposits 150 and the rate at which they accumulate may be exacerbated when running hot implant processes since some deposits are more attracted to a hot clamping surface. In addition, thermally activated reactions can occur on the hot clamping surface to create additional deposits. Trace amounts of materials such as carbon, fluorine, tungsten, and hydrogen may be present in the ion implanter 100. These materials can contribute to the thermally activated reactions to create additional unwanted deposits on the clamping surface 114 of the platen 112.

Advantageously, the clamping power supply 172 via circuitry 171 is configured to provide a sensed signal to the controller 120 representative of the AC signal provided to the pair of electrodes 160, 162. The controller 120 is configured to receive the sensed signal from the clamping power supply 172 and to monitor the sensed signal to determine if the sensed signal is representative of deposits on the clamping surface 114 exceeding a predetermined threshold.

Figure 2A:
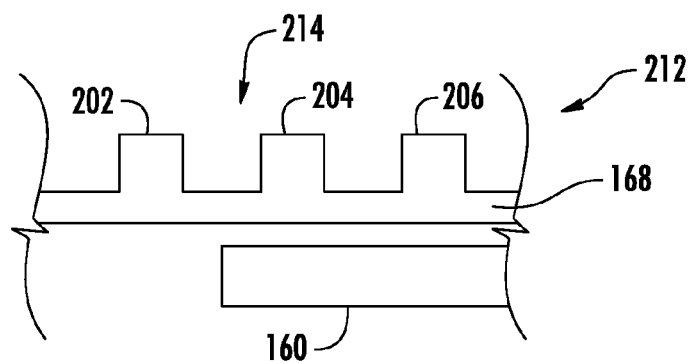
FIG. 2A is an enlarged partial cross sectional view of a clean clamping surface of a platen with no wafer present.
Figure 2B:
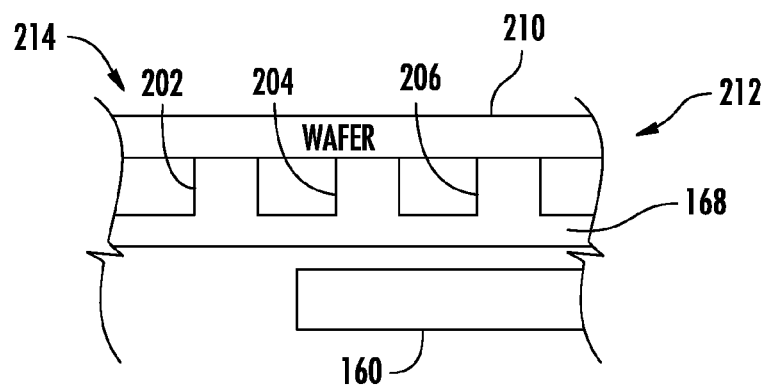
FIG. 2B is an enlarged partial cross sectional view of a clean clamping surface of the platen of FIG. 2A with a wafer present.
Figure 2C:
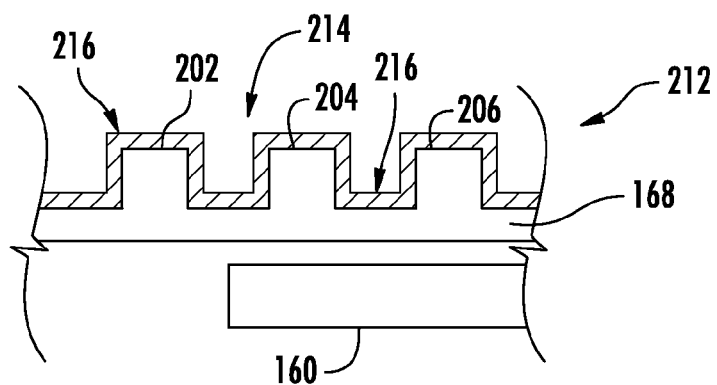
FIG. 2C is an enlarged partial cross sectional view of a dirty clamping surface of the platen of FIG. 2A with no wafer present.

Turning to FIG. 2A, an enlarged partial cross sectional view of a clamping surface 214 of a platen 212 consistent with the platen 112 of FIG. 1 is illustrated with no wafer and a clean clamping surface with no appreciable deposits. This view also shows three protrusions 202, 204, 206 or mesas which may have a height of about 5-7 micrometers. Other clamping surfaces without such protrusions may have a roughened texture. FIG. 2B illustrates the same enlarged partial cross sectional view of FIG. 2A of a clean clamping surface, but now with a wafer 210 in a clamped position so the underside of the clamped wafer 210 rests on the top surfaces of the protrusions 202, 204, 206. Finally, FIG. 2C illustrates the same enlarged partial cross sectional view of FIG. 2A with no wafer and a dirty clamping surface 214. In this example, deposits have formed a deposited layer 216 on the clamping surface 214.

During the no wafer and clean clamping surface condition of FIG. 2A, the AC signal provided by the clamping power supply 172 to the electrodes 160, 162 may have a nominal peak to peak amplitude. During the wafer clamp condition of FIG. 2B, the AC signal may have a peak to peak amplitude of about 6 to 7 times the nominal peak to peak amplitude of FIG.

2A. Finally, during the no wafer and dirty clamping surface condition of FIG. 2C, the AC signal may have a peak to peak amplitude greater than the nominal value of FIG. 2A but less than the value of FIG. 2B with a wafer. In one example, the amplitude of the current may be approximately 2.0 milliamperes (mA) in FIG. 2A, approximately 13 mA in FIG. 2B, and up to approximately 8 mA in FIG. 2C before wafer drops and breakage have been found to occur.

The deposits or deposited layer 216 which includes conductive and semiconductive deposits effectively behave as a type of clamped semiconductor wafer that is physically closer to the electrodes 160, 162 than the underside of the actual clamped wafer 210. The deposits 216 effectively form a quasi-layer or plate that changes the capacitance of the platen 214. The no wafer peak to peak current amplitude therefore tends to increase in proportion to the accumulation of deposits 216. With a three phase system (three electrode pairs or six total electrodes) each phase may be supplied with an AC signal 120° out of phase with the others. If the deposits accumulate uniformly on the clamping surface 214, the wafer off currents increase equally in all three phases. If the deposits accumulate non-uniformly (as it more likely the case), the wafer off currents in each phase will depart from each other providing an indication of non-uniform deposits and/or excessive deposit accumulation.

Figure 3:
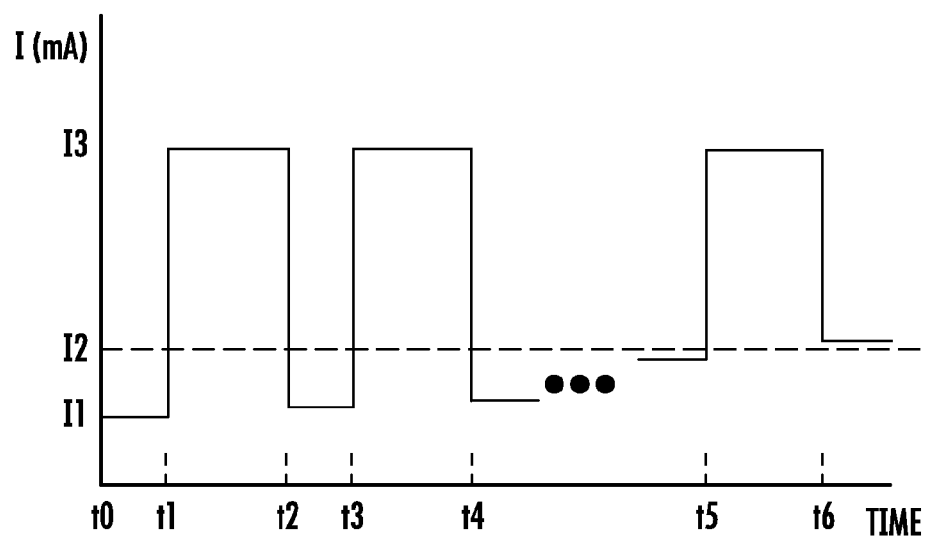
FIG. 3 is a plot of current of the AC signal provided by the clamping power supply of FIG. 1 versus time.

Turning to FIG. 3, a plot of peak to peak current (mA) of the AC signal provided by the clamping power supply 172 versus time is illustrated over a plurality of wafer off time intervals occurring between wafer clamping time intervals. Between times (t0) and (t1) no wafer is present and the clamping surface 214 of the platen 212 is clean as illustrated in FIG. 2A. The amplitude of the AC signal may have a nominal value of (I1) or about 2 mA. Between times (t1) and (t2) a first wafer is clamped to the clamping surface and the amplitude of the AC signal may rise to a value of (I3) or about 13 mA. Between times (t2) and (t3) no wafer is present again and a very slight rise in the no wafer current amplitude may be observed to be slightly higher than (I1). This process continues until finally at time (t6) the current level of the AC signal with no wafer exceeds a predetermined amplitude threshold (I2).

The predetermined amplitude threshold (I2) may be selected so that once it is exceeded during a wafer off time interval such as at time (t6), the controller 120 determines that the sensed signal from the clamping power supply 172 is representative of deposits on the clamping surface exceeding a predetermined deposit threshold. The predetermined amplitude threshold (I2) may be selected to be 2.5 mA in one embodiment. In response, the controller 120 may take corrective action. The correction action may include initiating a sputter clean process of the clamping surface as detailed further herein with respect to FIG. 4. The corrective action may also include automatically suspending operation by preventing another wafer from being clamped to the platen 112. The controller 120 may control the robot 132 to prevent it from placing another wafer on the platen until the clamping surface is sufficiently cleaned. In this way, the possibility of wafer dropping and wafer scrap can be greatly minimized. Alternatively, the controller 120 may issue an alert and provide the operator of the ion implanter with the discretion of when to initiate the cleaning process.

The controller 120 may also compare a rate of increase in amplitude of the current level of the AC signal over a time interval to a predetermined rate threshold. In other words, it is possible that the predetermined amplitude threshold (I2) may not be exceeded by the wafer off current level, but the rate of increase of the current level is great enough to exceed the predetermined rate threshold to prompt the controller 120 to take corrective action.

Figure 4:
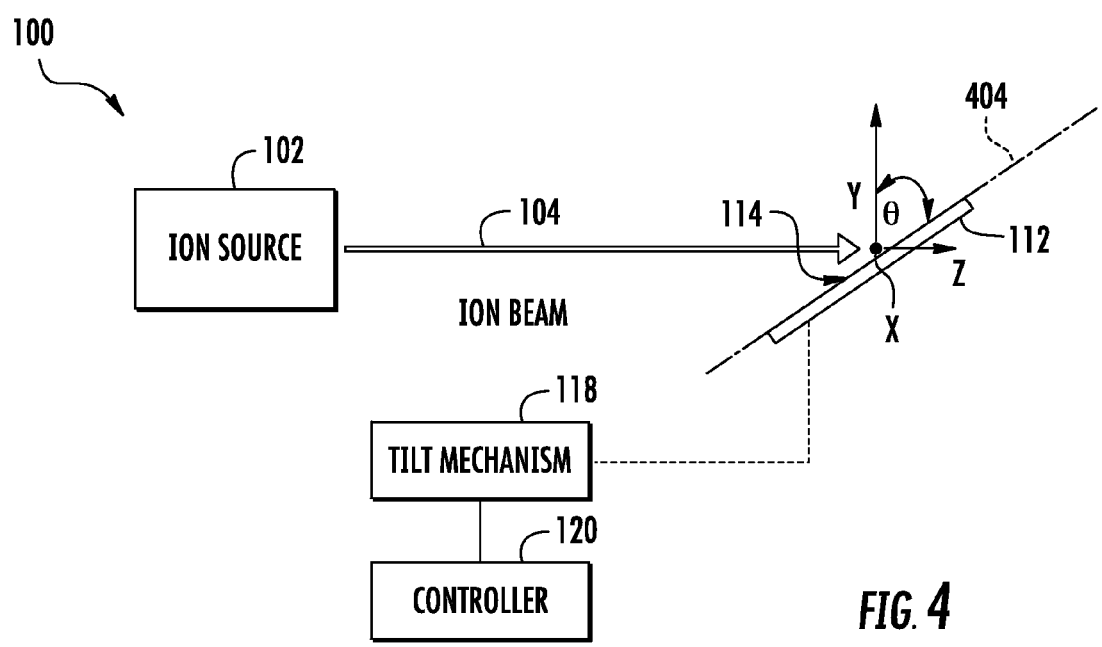
FIG. 4 is a cross sectional view of portions of the ion implanter of FIG. 1 oriented at an incident angle for a sputter clean process.

FIG. 4 illustrates a sputter clean process that may be initiated by the controller 120 in response to the sensed signal representative of deposits on the clamping surface exceeding a predetermined deposit threshold. The controller 120 may instruct the tilt mechanism 118 to tilt the platen 112 to achieve a desired incident angle θ relative to the path of a particular low energy ion beam 104.

To assist with explanation of the incident angle θ, a Cartesian coordinate system may be defined where the path of the ion beam 104 defines a Z axis. The Z axis intersects an orthogonal plane. An X axis is a horizontal axis in this plane. A Y axis is orthogonal to the X axis and is a vertical axis in this plane. As illustrated in FIG. 4, the platen 112 is tilted by the tilting mechanism 118 about the X axis by sometimes referred to in the art as an "X-tilt." The incident angle θ may be defined as the angle between a plane 404 defined by the clamping surface 114 of the platen 112 and the Y axis as illustrated in FIG. 4.

The incident angle θ may be in a range that is less than 90 degrees but greater than 40 degrees to increase the sputter yield. In one embodiment, the incident angle θ may be 70 degrees. A scanning system (not illustrated) for the platen 112 may translate the platen vertically in the Y direction during the sputter clean process so that ion beam 104 strikes the entire clamping surface 114 of the platen 112. In one embodiment, the ion implanter 100 may provide an Ar+ ion beam of low energy (about 5 keV) having about 5 to 15 milliamps (mA) beam current.

The controller 120 may also monitor the removal rate of deposits during the sputter clean process by analyzing the sensed signal representative of the amplitude of the no wafer current level. In this way, the effectiveness of different ion beam recipes can be compared and contrasted. In addition, once to the removal rate is known, the controller 120 can perform calculations to ascertain the total expected cleaning time. In this way, the impact to the ion implanter productivity can be minimized.

Accordingly, there has been provided an ion implanter having a controller configured to monitor a condition of clamping surface of a platen by monitoring the amplitude of an AC signal provided to electrodes of the platen with no wafer clamped to the platen. An increase in the amplitude of the AC signal with no wafer is indicative of accumulating deposits. Eventually, the clamping abilities of the platen may be compromised if deposit accumulation becomes excessive. The controller may compare the amplitude of the AC signal with no wafer to a predetermined amplitude threshold selected to minimize the chance of clamping failure. This enables the condition of the clamping surface to be monitored in situ during ion implantation without impacting the throughput of the ion implanter. In addition, this provides predictive capabilities to determine when corrective action needs to be taken to both minimize the number of cleaning interruptions but yet also assure that cleaning is performed when necessary to minimize wafer drops and breakage events. Corrective action can include automatically initiating a sputter clean process and suspending ion treatment of additional wafers until properly cleaned. This is especially helpful for hot implants which are more prone to deposit accumulation compared with room temperature implants.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context to of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. An ion implanter comprising:
a platen having a clamping surface configured to support a wafer for treatment with ions, the platen also having at least one pair of electrodes under the clamping surface;
a clamping power supply configured to provide an AC signal to the at least one pair of electrodes and a sensed signal representative of the AC signal; and
a controller configured to receive the sensed signal from the clamping power supply when no wafer is clamped to the clamping surface, the controller further configured to monitor the sensed signal and determine if the sensed signal is representative of deposits on the clamping surface exceeding a predetermined deposit threshold.

2. The ion implanter of claim 1, wherein the controller is further configured to determine if the sensed signal is representative of deposits on the clamping surface exceeding the predetermined deposit threshold by analyzing if an amplitude of a current level of the AC signal exceeds a predetermined amplitude threshold when no wafer is clamped to the clamping surface.

3. The ion implanter of claim 2, wherein the predetermined amplitude threshold is 2.5 mA peak to peak.

4. The ion implanter of claim 2, wherein the controller is further configured to initiate a sputter clean process of the clamping surface of the platen if the amplitude of the AC signal exceeds the predetermined amplitude threshold.

5. The ion implanter of claim 2, wherein the controller is further configured to prevent another wafer from being clamped to the clamping surface until the amplitude of the AC signal is less than the predetermined amplitude threshold.

6. The ion implanter of claim 1, wherein the controller is further configured to determine if the sensed signal is representative of deposits on the clamping surface exceeding the predetermined deposit threshold by analyzing if to a rate of increase in an amplitude of a current level of the AC signal over a time interval exceeds a predetermined rate threshold.

7. The ion implanter of claim 6, wherein the time interval includes a plurality of wafer off time intervals occurring between wafer clamping time intervals.

8. The ion implanter of claim 1, wherein the AC signal comprises a square wave signal.

9. A method of operating an ion implanter comprising:
providing an AC signal to at least one pair of electrodes of a platen having a clamping surface;
monitoring a sensed signal representative of the AC signal when no wafer is clamped to the clamping surface; and
determining if the sensed signal is representative of deposits on the clamping surface exceeding a predetermined deposit threshold when no wafer is clamped to the clamping surface.

10. The method of claim 9, further comprising comparing an amplitude of a current level of the AC signal to a predetermined amplitude threshold when no wafer is clamped to the clamping surface to determine if the sensed signal is representative of deposits on the clamping surface exceeding the predetermined deposit threshold.

11. The method of claim 10, wherein the sensed signal is representative of deposits on the clamping surface exceeding the predetermined deposit threshold if the amplitude of the AC signal is greater than the to predetermined amplitude threshold.

12. The method of claim 10, wherein the sensed signal is representative of deposits on the clamping surface less than the predetermined deposit threshold if the amplitude of the AC signal is less than the predetermined amplitude threshold.

13. The method of claim 10, wherein the predetermined amplitude threshold is 2.5 mA peak to peak.

14. The method of claim 10, further comprising initiating a sputter clean process of the clamping surface of the platen if the amplitude of the AC signal is greater than the predetermined amplitude threshold.

15. The method of claim 14, further comprising monitoring the sensed signal during the sputter clean process and correlating the sensed signal to a removal rate of the deposits.

16. The method of claim 15, further comprising calculating an expected clean time interval in response to the removal rate.

17. The method of claim 14, further comprising preventing a wafer from being clamped to the clamping surface until the amplitude of the AC signal is less than the predetermined amplitude threshold.

* * * * *